United States Patent
Okamoto et al.

(10) Patent No.: US 8,525,330 B2
(45) Date of Patent: Sep. 3, 2013

(54) CONNECTING MEMBER FOR CONNECTING A SEMICONDUCTOR ELEMENT AND A FRAME, FORMED OF AN AL-BASED LAYER AND FIRST AND SECOND ZN-BASED LAYERS PROVIDED ON SURFACES OF THE AL-BASED LAYER

(75) Inventors: Masahide Okamoto, Yokohama (JP); Osamu Ikeda, Yokohama (JP); Yuki Murasato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/382,633

(22) PCT Filed: Aug. 30, 2010

(86) PCT No.: PCT/JP2010/005313
§ 371 (c)(1),
(2), (4) Date: Jan. 6, 2012

(87) PCT Pub. No.: WO2011/030517
PCT Pub. Date: Mar. 17, 2011

(65) Prior Publication Data
US 2012/0098134 A1      Apr. 26, 2012

(30) Foreign Application Priority Data

Sep. 9, 2009 (JP) ................... 2009-207684
Sep. 11, 2009 (JP) ................... 2009-209957

(51) Int. Cl.
*H01L 23/48* (2006.01)
*H01L 23/52* (2006.01)
*H01L 29/40* (2006.01)

(52) U.S. Cl.
USPC ........... 257/736; 257/765; 257/771; 257/781; 257/E29.079; 257/E29.09; 257/E29.297

(58) Field of Classification Search
USPC .................. 257/736, 765, 771, 781, E29.079, 257/E29.09, E29.297
See application file for complete search history.

(56) References Cited

U.S. PATENT DOCUMENTS

| | | | | |
|---|---|---|---|---|
| 4,464,602 A | * | 8/1984 | Murphy | 313/509 |
| 4,818,728 A | * | 4/1989 | Rai et al. | 438/108 |
| 4,965,660 A | * | 10/1990 | Ogihara et al. | 257/717 |
| 5,192,835 A | * | 3/1993 | Bull et al. | 174/260 |
| 5,227,812 A | * | 7/1993 | Watanabe et al. | 347/50 |

(Continued)

FOREIGN PATENT DOCUMENTS

| | | |
|---|---|---|
| JP | 3850135 | 9/2006 |
| JP | 3945915 | 4/2007 |
| JP | 2007-326137 | 12/2007 |
| JP | 2008-126272 | 6/2008 |

*Primary Examiner* — Ida M Soward
(74) *Attorney, Agent, or Firm* — Antonelli, Terry, Stout & Kraus, LLP.

(57) ABSTRACT

Provided is a connecting part for a semiconductor device including a semiconductor element, a frame, and a connecting part which connects the semiconductor element and the frame to each other, in which an interface between the connecting part and the semiconductor element and an interface between the connecting part and the frame respectively have the area of Al oxide film which is more than 0% and less than 5% of entire area of the respective interfaces. The connecting part has an Al-based layer and first and second Zn-based layers on main surfaces of the Al-based layer, a thickness ratio of the Al-based layer relative to the Zn-based layers being less than 0.59.

3 Claims, 18 Drawing Sheets

101: Zn LAYER    102: Al LAYER

| CLADDING MATERIAL | THICKNESS (μm) | | | REMARK |
|---|---|---|---|---|
| | Zn LAYER | Al LAYER | Zn LAYER | |
| CLADDING MATERIAL 1 | 19 | 10 | 19 | CONNECTING MATERIAL |
| CLADDING MATERIAL 2 | 38 | 20 | 38 | CONNECTING MATERIAL |
| CLADDING MATERIAL 3 | 76 | 40 | 76 | CONNECTING MATERIAL |
| CLADDING MATERIAL 4 | 25 | 15 | 25 | CONNECTING MATERIAL |
| CLADDING MATERIAL 5 | 20 | 40 | 20 | COMPARATIVE MATERIAL |
| CLADDING MATERIAL 6 | 20 | 70 | 20 | COMPARATIVE MATERIAL |
| CLADDING MATERIAL 7 | 20 | 110 | 20 | COMPARATIVE MATERIAL |

(56) References Cited

U.S. PATENT DOCUMENTS

| | | | | |
|---|---|---|---|---|
| 5,394,303 | A * | 2/1995 | Yamaji | 361/749 |
| 5,955,210 | A * | 9/1999 | Katayama et al. | 428/690 |
| 6,238,808 | B1 * | 5/2001 | Arao et al. | 428/629 |
| 6,472,072 | B1 * | 10/2002 | Ebisawa et al. | 428/432 |
| 6,608,328 | B2 * | 8/2003 | Kuo et al. | 257/79 |
| 7,045,831 | B2 * | 5/2006 | Narazaki | 257/177 |
| 7,494,717 | B2 * | 2/2009 | Decroupet et al. | 428/428 |
| 7,498,053 | B2 * | 3/2009 | Lim et al. | 427/66 |
| 7,700,406 | B2 * | 4/2010 | Fee et al. | 438/106 |
| 8,158,273 | B2 * | 4/2012 | Wittebrood | 428/654 |
| 2006/0105193 | A1 * | 5/2006 | Burger et al. | 428/654 |
| 2008/0206590 | A1 | 8/2008 | Ikeda et al. | |
| 2008/0299384 | A1 * | 12/2008 | Kim et al. | 428/336 |
| 2010/0326817 | A1 * | 12/2010 | Myli et al. | 204/192.15 |

* cited by examiner

FIG. 5

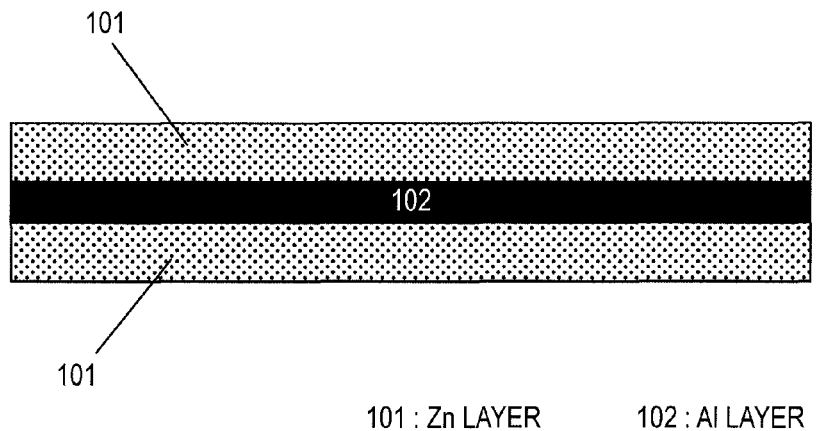

101 : Zn LAYER    102 : Al LAYER

FIG. 6

| CLADDING MATERIAL | THICKNESS (μm) | | | REMARK |
|---|---|---|---|---|
| | Zn LAYER | Al LAYER | Zn LAYER | |
| CLADDING MATERIAL 1 | 19 | 10 | 19 | CONNECTING MATERIAL |
| CLADDING MATERIAL 2 | 38 | 20 | 38 | CONNECTING MATERIAL |
| CLADDING MATERIAL 3 | 76 | 40 | 76 | CONNECTING MATERIAL |
| CLADDING MATERIAL 4 | 25 | 15 | 25 | CONNECTING MATERIAL |
| CLADDING MATERIAL 5 | 20 | 40 | 20 | COMPARATIVE MATERIAL |
| CLADDING MATERIAL 6 | 20 | 70 | 20 | COMPARATIVE MATERIAL |
| CLADDING MATERIAL 7 | 20 | 110 | 20 | COMPARATIVE MATERIAL |

FIG. 9

| WORKING EXAMPLE | CONNECTING MATERIAL | FRAME PLATING | CONNECTING TEMPERATURE | CONNECTING TIME | WETTABILITY | STRESS RELAXATION PROPERTIES | PRESSURIZING WHEN CONNECTING |
|---|---|---|---|---|---|---|---|
| 1 | CLADDING MATERIAL1 | Ni | 400°C | 2min | ○ | △ | NO |
| 2 | CLADDING MATERIAL1 | Ni/Ag | 400°C | 2min | ○ | △ | NO |
| 3 | CLADDING MATERIAL1 | Ni/Au | 400°C | 2min | ○ | △ | NO |
| 4 | CLADDING MATERIAL2 | Ni | 400°C | 5min | ○ | ○ | NO |
| 5 | CLADDING MATERIAL2 | Ni/Ag | 400°C | 5min | ○ | ○ | NO |
| 6 | CLADDING MATERIAL2 | Ni/Au | 400°C | 5min | ○ | ○ | NO |
| 7 | CLADDING MATERIAL3 | Ni | 420°C | 5min | ○ | ○ | NO |
| 8 | CLADDING MATERIAL3 | Ni/Ag | 420°C | 5min | ○ | ○ | NO |
| 9 | CLADDING MATERIAL3 | Ni/Au | 420°C | 5min | ○ | ○ | NO |
| 10 | CLADDING MATERIAL4 | Ni | 420°C | 5min | ○ | ○ | NO |
| 11 | CLADDING MATERIAL4 | Ni/Ag | 420°C | 5min | ○ | ○ | NO |
| 12 | CLADDING MATERIAL4 | Ni/Au | 420°C | 5min | ○ | ○ | NO |

| COMPARATIVE EXAMPLE | CONNECTING MATERIAL | FRAME PLATING | CONNECTING TEMPERATURE | CONNECTING TIME | WETTABILITY | STRESS RELAXATION PROPERTIES | PRESSURIZING WHEN CONNECTING |
|---|---|---|---|---|---|---|---|
| 1 | CLADDING MATERIAL5 | Ni | 400°C | 2min | ○ | ○ | 1.75g/mm² |
| 2 | CLADDING MATERIAL5 | Ni/Ag | 400°C | 2min | ○ | ○ | 1.75g/mm² |
| 3 | CLADDING MATERIAL5 | Ni/Au | 400°C | 2min | ○ | ○ | 1.75g/mm² |
| 4 | CLADDING MATERIAL6 | Ni | 400°C | 2min | ○ | ○ | 1.75g/mm² |
| 5 | CLADDING MATERIAL6 | Ni/Ag | 400°C | 2min | ○ | ○ | 1.75g/mm² |
| 6 | CLADDING MATERIAL6 | Ni/Au | 400°C | 2min | ○ | ○ | 1.75g/mm² |
| 7 | CLADDING MATERIAL7 | Ni | 400°C | 2min | ○ | ○ | 1.75g/mm² |
| 8 | CLADDING MATERIAL7 | Ni/Ag | 400°C | 2min | ○ | ○ | 1.75g/mm² |
| 9 | CLADDING MATERIAL7 | Ni/Au | 400°C | 2min | ○ | ○ | 1.75g/mm² |
| 10 | Zn-6Al-5Ge | Ni | 420°C | 1min | × | — | 1.75g/mm² |
| 11 | Zn-6Al-5Ge | Ni/Ag | 420°C | 1min | × | — | 1.75g/mm² |
| 12 | Zn-6Al-5Ge | Ni/Au | 420°C | 1min | × | — | 1.75g/mm² |
| 13 | Zn | Ni | 4250°C | 1min | ○ | × | 1.75g/mm² |
| 14 | Zn | Ni/Ag | 450°C | 1min | ○ | × | 1.75g/mm² |
| 15 | Zn | Ni/Au | 450°C | 1min | ○ | × | 1.75g/mm² |
| 16 | Pb-1.5Ag-5Sn | Ni | 360°C | 2min | ○ | ○ | 0.02g/mm² |
| 17 | Pb-1.5Ag-5Sn | Ni/Ag | 360°C | 2min | ○ | ○ | 0.02g/mm² |
| 18 | Pb-1.5Ag-5Sn | Ni/Au | 360°C | 2min | ○ | ○ | 0.02g/mm² |

$-55°C / 150°C (15min / 15min)$

FIG. 13

| WORKING EXAMPLE | CONNECTING MATERIAL | FRAME PLATING | CONNECTING TEMPERATURE | CONNECTING TIME | WETTABILITY | PRESSURIZING WHEN CONNECTING |
|---|---|---|---|---|---|---|
| 13 | CLADDING MATERIAL1 | Ni | 400°C | 2min | ○ | NIL |
| 14 | CLADDING MATERIAL1 | Ni/Ag | 400°C | 2min | ○ | NIL |
| 15 | CLADDING MATERIAL1 | Ni/Au | 400°C | 2min | ○ | NIL |
| 16 | CLADDING MATERIAL2 | Ni | 400°C | 5min | ○ | NIL |
| 17 | CLADDING MATERIAL2 | Ni/Ag | 400°C | 5min | ○ | NIL |
| 18 | CLADDING MATERIAL2 | Ni/Au | 400°C | 5min | ○ | NIL |
| 19 | CLADDING MATERIAL3 | Ni | 420°C | 5min | ○ | NIL |
| 20 | CLADDING MATERIAL3 | Ni/Ag | 420°C | 5min | ○ | NIL |
| 21 | CLADDING MATERIAL3 | Ni/Au | 420°C | 5min | ○ | NIL |
| 22 | CLADDING MATERIAL4 | Ni | 420°C | 5min | ○ | NIL |
| 23 | CLADDING MATERIAL4 | Ni/Ag | 420°C | 5min | ○ | NIL |
| 24 | CLADDING MATERIAL4 | Ni/Au | 420°C | 5min | ○ | NIL |
| COMPARATIVE EXAMPLE | CONNECTING MATERIAL | FRAME PLATING | CONNECTING TEMPERATURE | CONNECTING TIME | WETTABILITY | PRESSURIZING WHEN CONNECTING |
| 19 | CLADDING MATERIAL5 | Ni | 400°C | 2min | ○ | 1.75g/mm$^2$ |
| 20 | CLADDING MATERIAL5 | Ni/Ag | 400°C | 2min | ○ | 1.75g/mm$^2$ |
| 21 | CLADDING MATERIAL5 | Ni/Au | 400°C | 2min | ○ | 1.75g/mm$^2$ |
| 22 | CLADDING MATERIAL6 | Ni | 400°C | 2min | ○ | 1.75g/mm$^2$ |
| 23 | CLADDING MATERIAL6 | Ni/Ag | 400°C | 2min | ○ | 1.75g/mm$^2$ |
| 24 | CLADDING MATERIAL6 | Ni/Au | 400°C | 2min | ○ | 1.75g/mm$^2$ |
| 25 | Zn-6Al-5Ge | Ni | 420°C | 1min | × | 1.75g/mm$^2$ |
| 26 | Zn-6Al-5Ge | Ni/Ag | 420°C | 1min | × | 1.75g/mm$^2$ |
| 27 | Zn-6Al-5Ge | Ni/Au | 420°C | 1min | × | 1.75g/mm$^2$ |

301 : Zn LAYER    302 : Al-BASED ALLOY LAYER

FIG. 20

| CLADDING MATERIAL | THICKNESS (μm) | | | COMPOSITION OF Al ALLOY LAYER (mass%) | REMARK |
|---|---|---|---|---|---|
| | Zn LAYER | Al ALLOY LAYER | Zn LAYER | | |
| CLADDING MATERIAL 8 | 20 | 40 | 20 | Al-44Mg | CONNECTING MATERIAL |
| CLADDING MATERIAL 9 | 20 | 70 | 20 | Al-44Mg | CONNECTING MATERIAL |
| CLADDING MATERIAL 10 | 20 | 110 | 20 | Al-44Mg | CONNECTING MATERIAL |
| CLADDING MATERIAL 11 | 20 | 40 | 20 | Al-34Mg-23Sn | CONNECTING MATERIAL |
| CLADDING MATERIAL 12 | 20 | 70 | 20 | Al-34Mg-23Sn | CONNECTING MATERIAL |
| CLADDING MATERIAL 13 | 20 | 110 | 20 | Al-34Mg-23Sn | CONNECTING MATERIAL |
| CLADDING MATERIAL 14 | 20 | 40 | 20 | Al-27Mg-36Ge | CONNECTING MATERIAL |
| CLADDING MATERIAL 15 | 20 | 70 | 20 | Al-27Mg-36Ge | CONNECTING MATERIAL |
| CLADDING MATERIAL 16 | 20 | 110 | 20 | Al-27Mg-36Ge | CONNECTING MATERIAL |
| CLADDING MATERIAL 17 | 20 | 40 | 20 | Al | COMPARATIVE MATERIAL |
| CLADDING MATERIAL 18 | 20 | 70 | 20 | Al | COMPARATIVE MATERIAL |
| CLADDING MATERIAL 19 | 20 | 110 | 20 | Al | COMPARATIVE MATERIAL |

FIG. 23

| WORKING EXAMPLE | CONNECTING MATERIAL | FRAME PLATING | CONNECTING TEMPERATURE | CONNECTING TIME | WETTABILITY | CHIP CRACKING AFTER CONNECTED |
|---|---|---|---|---|---|---|
| 25 | CLADDING MATERIAL8 | Ni | 350°C | 2min | ○ | NIL |
| 26 | CLADDING MATERIAL8 | Ni/Ag | 350°C | 2min | ○ | NIL |
| 27 | CLADDING MATERIAL8 | Ni/Au | 350°C | 2min | ○ | NIL |
| 28 | CLADDING MATERIAL9 | Ni | 350°C | 2min | ○ | NIL |
| 29 | CLADDING MATERIAL9 | Ni/Ag | 350°C | 2min | ○ | NIL |
| 30 | CLADDING MATERIAL9 | Ni/Au | 350°C | 2min | ○ | NIL |
| 31 | CLADDING MATERIAL10 | Ni | 350°C | 2min | ○ | NIL |
| 32 | CLADDING MATERIAL10 | Ni/Ag | 350°C | 2min | ○ | NIL |
| 33 | CLADDING MATERIAL10 | Ni/Au | 350°C | 2min | ○ | NIL |
| 34 | CLADDING MATERIAL11 | Ni | 350°C | 2min | ○ | NIL |
| 35 | CLADDING MATERIAL11 | Ni/Ag | 350°C | 2min | ○ | NIL |
| 36 | CLADDING MATERIAL11 | Ni/Au | 350°C | 2min | ○ | NIL |
| 37 | CLADDING MATERIAL12 | Ni | 350°C | 2min | ○ | NIL |
| 38 | CLADDING MATERIAL12 | Ni/Ag | 350°C | 2min | ○ | NIL |
| 39 | CLADDING MATERIAL12 | Ni/Au | 350°C | 2min | ○ | NIL |
| 40 | CLADDING MATERIAL13 | Ni | 350°C | 2min | ○ | NIL |
| 41 | CLADDING MATERIAL13 | Ni/Ag | 350°C | 2min | ○ | NIL |
| 42 | CLADDING MATERIAL13 | Ni/Au | 350°C | 2min | ○ | NIL |
| 43 | CLADDING MATERIAL14 | Ni | 350°C | 2min | ○ | NIL |
| 44 | CLADDING MATERIAL14 | Ni/Ag | 350°C | 2min | ○ | NIL |
| 45 | CLADDING MATERIAL14 | Ni/Au | 350°C | 2min | ○ | NIL |
| 46 | CLADDING MATERIAL15 | Ni | 350°C | 2min | ○ | NIL |
| 47 | CLADDING MATERIAL15 | Ni/Ag | 350°C | 2min | ○ | NIL |
| 48 | CLADDING MATERIAL15 | Ni/Au | 350°C | 2min | ○ | NIL |
| 49 | CLADDING MATERIAL16 | Ni | 350°C | 2min | ○ | NIL |
| 50 | CLADDING MATERIAL16 | Ni/Ag | 350°C | 2min | ○ | NIL |
| 51 | CLADDING MATERIAL16 | Ni/Au | 350°C | 2min | ○ | NIL |
| COMPARATIVE EXAMPLE | CONNECTING MATERIAL | FRAME PLATING | CONNECTING TEMPERATURE | CONNECTING TIME | WETTABILITY | CHIP CRACKING AFTER CONNECTED |
| 28 | CLADDING MATERIAL17 | Ni | 400°C | 2min | ○ | OCCURRED |
| 29 | CLADDING MATERIAL17 | Ni/Ag | 400°C | 2min | ○ | OCCURRED |
| 30 | CLADDING MATERIAL17 | Ni/Au | 400°C | 2min | ○ | OCCURRED |
| 31 | CLADDING MATERIAL18 | Ni | 400°C | 2min | ○ | OCCURRED |
| 32 | CLADDING MATERIAL18 | Ni/Ag | 400°C | 2min | ○ | OCCURRED |
| 33 | CLADDING MATERIAL18 | Ni/Au | 400°C | 2min | ○ | OCCURRED |
| 34 | CLADDING MATERIAL19 | Ni | 400°C | 2min | ○ | OCCURRED |
| 35 | CLADDING MATERIAL19 | Ni/Ag | 400°C | 2min | ○ | OCCURRED |
| 36 | CLADDING MATERIAL19 | Ni/Au | 400°C | 2min | ○ | OCCURRED |

FIG. 24

| WORKING EXAMPLE | CONNECTING MATERIAL | FRAME PLATING | CONNECTING TEMPERATURE | CONNECTING TIME | WETTABILITY | CRACK OF CONNECTING SECTION AFTER CONNECTED |
|---|---|---|---|---|---|---|
| 52 | CLADDING MATERIAL 8 | Ni | 350°C | 2min | ○ | NIL |
| 53 | CLADDING MATERIAL 8 | Ni/Ag | 350°C | 2min | ○ | NIL |
| 54 | CLADDING MATERIAL 8 | Ni/Au | 350°C | 2min | ○ | NIL |
| 55 | CLADDING MATERIAL 9 | Ni | 350°C | 2min | ○ | NIL |
| 56 | CLADDING MATERIAL 9 | Ni/Ag | 350°C | 2min | ○ | NIL |
| 57 | CLADDING MATERIAL 9 | Ni/Au | 350°C | 2min | ○ | NIL |
| 58 | CLADDING MATERIAL 10 | Ni | 350°C | 2min | ○ | NIL |
| 59 | CLADDING MATERIAL 10 | Ni/Ag | 350°C | 2min | ○ | NIL |
| 60 | CLADDING MATERIAL 10 | Ni/Au | 350°C | 2min | ○ | NIL |
| 61 | CLADDING MATERIAL 11 | Ni | 350°C | 2min | ○ | NIL |
| 62 | CLADDING MATERIAL 11 | Ni/Ag | 350°C | 2min | ○ | NIL |
| 63 | CLADDING MATERIAL 11 | Ni/Au | 350°C | 2min | ○ | NIL |
| 64 | CLADDING MATERIAL 12 | Ni | 350°C | 2min | ○ | NIL |
| 65 | CLADDING MATERIAL 12 | Ni/Ag | 350°C | 2min | ○ | NIL |
| 66 | CLADDING MATERIAL 12 | Ni/Au | 350°C | 2min | ○ | NIL |
| 67 | CLADDING MATERIAL 13 | Ni | 350°C | 2min | ○ | NIL |
| 68 | CLADDING MATERIAL 13 | Ni/Ag | 350°C | 2min | ○ | NIL |
| 69 | CLADDING MATERIAL 13 | Ni/Au | 350°C | 2min | ○ | NIL |
| COMPARATIVE EXAMPLE | CONNECTING MATERIAL | FRAME PLATING | CONNECTING TEMPERATURE | CONNECTING TIME | WETTABILITY | CRACK OF CONNECTING SECTION AFTER CONNECTED |
| 37 | CLADDING MATERIAL 17 | Ni | 400°C | 2min | ○ | OCCURRED |
| 38 | CLADDING MATERIAL 17 | Ni/Ag | 400°C | 2min | ○ | OCCURRED |
| 39 | CLADDING MATERIAL 17 | Ni/Au | 400°C | 2min | ○ | OCCURRED |
| 40 | CLADDING MATERIAL 18 | Ni | 400°C | 2min | ○ | OCCURRED |
| 41 | CLADDING MATERIAL 18 | Ni/Ag | 400°C | 2min | ○ | OCCURRED |
| 42 | CLADDING MATERIAL 18 | Ni/Au | 400°C | 2min | ○ | OCCURRED |

CONNECTING MEMBER FOR CONNECTING A SEMICONDUCTOR ELEMENT AND A FRAME, FORMED OF AN AL-BASED LAYER AND FIRST AND SECOND ZN-BASED LAYERS PROVIDED ON SURFACES OF THE AL-BASED LAYER

BACKGROUND

The present invention relates to a connecting material and a semiconductor device.

Adverse effects of the lead against human nerves and hematogenic systems have been proved. In Europe, the ELV Directive (End-of Life Vehicles Directive) restricting the use of a lead in vehicles and the RoHs (Restriction of the use of certain Hazardous Substances in electrical and electronic equipment) prohibiting the use of a lead in electrical and electronic equipment have been put in force in October, 2000 and in July, 2006 respectively. Conventionally, solders used for electric connections of components of electrical and electronic equipment contained the lead. Depending on the melting point, solders are classified into three types including a high temperature solder, a medium temperature solder, and a low temperature solder. Medium temperature solders such as Sn—Ag—Cu based solder, Sn—Cu based solder, and the like, and low temperature solders such as Sn—Bi based solder, Sn—In based solder, and the like have been developed, put into practical use and met requirements of the ELV Directive and the RoHS Directive. In the meantime, lead content of such solders is high at 85% or more, and a lead-free highly heat resistant connecting material which would replace with the high lead solders having a high melting point has not yet been developed. For this reason, those high lead solders are exempted from application of the ELV Directive and the RoHS Directive mentioned above. However, the high lead solders contain 85 wt % or more of lead as their component, and, therefore, give a big environmental impact compared with the Sn—Pb eutectic solder prohibited by the RoHS Directive. Accordingly, development of an alternative connecting material in place of the high lead solders is desired anxiously.

Patent Literature 1 (Japanese Patent No. 3850135) discloses "a high temperature soldering Zn alloy comprising Al of 1 to 9 mass %, Ge of 0.05 to 1 mass %, and the rest including Zn and unavoidable impurities".

Further, Patent Literature 2 (Japanese Patent No. 3945915) discloses "a soldering Zn alloy comprising Al of 1 to 9 mass %, Mg of more than 0.05 mass % and less than 0.5 mass %, Ga of 0.1 to 8 mass %, and the rest including Zn and unavoidable impurities".

Further, Patent Literature 3 (Japanese Patent Application Laid-Open Publication No. 2008-126272) discloses "a connecting material comprising an Al-based alloy layer and Zn-based alloy layers respectively provided on each of outermost surfaces of the Al based alloy layer, and more particularly, a connecting material comprising an Al-based alloy layer having an Al content of 99 to 100 wt %, or a Zn-based alloy layer having a Zn content of 90 to 100 wt %".

Here, an application example of a conventional highly heat resistant connecting material is described with reference to FIG. 1 and FIG. 2. FIG. 1 shows an example of a structure of a conventional semiconductor device, and FIG. 2 illustrates a flash which occurred due to re-melting of a solder in the conventional semiconductor device.

As shown in FIG. 1, semiconductor device 7 is fabricated by a method including the steps of: connecting (die bonding) a semiconductor element 1 onto a frame 2 with solder 3, wire bonding inner lead of a lead 5 and an electrode of the semiconductor element 1 to each other via a wire 4, and then sealing with a sealing resin 6 or inert gas.

The semiconductor device 7 is reflow-soldered onto a printed substrate with an Sn—Ag—Cu based medium temperature lead-free solder. A melting point of the Sn—Ag—Cu based lead-free solder is high at about 220° C. Therefore, it is assumed that the connecting part is heated up to 260° C. when reflow-soldered. For this reason, a high lead solder having a melting point higher than 290° C. is used to prevent re-melting of the connecting (die bonding) part when reflow-soldered.

Currently, developed medium temperature lead-free solders such as an Sn—Ag—Cu based solder or the like have a melting point of about 220° C. When used for die bonding a semiconductor element, the solder is melted when a semiconductor device is reflow-soldered onto the printed substrate. If circumference of the connecting part is molded with resin, melting of inner solder may cause the solder 3 to leak through an interface between the sealing resin 6 and the frame 2 due to volume expansion occurring during melting, as shown in FIG. 2, a so-called phenomenon of the flash. Yet, even if no leakage occurs, the solder acts to leak out. As a result, a big void 8 is formed in the solidified solder, which might cause a semiconductor device to be defective. As a candidate for an alternative material, Au-based solders such as an Au—Sn based alloy, an Au—Si based alloy, an Au—Ga based alloy, or the like, Zn based and Zn—Al based solders, and Bi based, Bi—Cu based, Bi—Ag based solders or the like have been reported and are being reviewed in the world in terms of the melting point.

However, an Au-based solder lacks versatility in terms of the cost as it contains Au of more than 80 wt % as a component, and it is a hard and brittle solder, as well. A Bi-based solder has a thermal conductivity of about 9 W/m.K, which is lower than that of existing high lead solders. Therefore, it may be assumed that it is difficult to apply such solder to a power semiconductor device, a power module, or the like which require high heat dissipation. Further, the solder is hard and brittle, as well. A Zn-based solder and a Zn—Al based solder have a high thermal conductivity of about 100 W/m.K, but such solders (particularly, Zn—Al based solder) are unlikely to wet. Further, those solders are hard and have a big coefficient of thermal expansion. Therefore, there is a problem that a semiconductor element is likely to be broken by thermal stress applied when cooling down after connecting. Further, since pure Zn is highly reactive, interface reactions proceed significantly when temperature becomes high. Therefore, even if a good connection could have been attained, high heat resistance cannot be obtained.

Further, as a connecting material which addresses problems with the Zn—Al based solder of being unlikely to wet and being hard, a method using a Zn/Al/Zn cladding material is disclosed. According to the disclosure, a superficial Zn layer ensures the wettability (connectivity), and an inner layer comprising Al of a soft metal has a stress relaxation performance sufficient to ensure the connection reliability. Further, melting points of Zn and Al are 420° C. and 660° C. respectively, and a melting point of a Zn—Al eutectic (Zn-6Al) generated by the diffusion of Zn and Al is 382° C. Thus, the connecting material has a high melting point and high heat resistance.

CITATION LIST

Patent Literature
Patent Literature 1: Japanese Patent No. 3850135

Patent Literature 2: Japanese Patent No. 3945915
Patent Literature 3: Japanese Patent Application Lad-Open Publication No. 2008-126272

SUMMARY OF INVENTION

As for the Zn—Al based solder described in Patent Literature 1 and Patent Literature 2, since the solder contains Al as a component, an Al oxide film is formed on the surface thereof simultaneously when the solder is melted. Therefore, sufficient wetting cannot be obtained without breaking the oxide film mechanically. In this case, even if connecting could be attained, the connection is made just very locally, so that an obtainable connecting strength is very weak and not suitable for practical use of the solder.

On the other hand, the present inventors reviewed about a connecting method which uses a Zn/Al/Zn cladding material described in Patent Literature 3, and verified that the cladding material provides the connectivity and the connection reliability. However, it was found that thickness thereof at a connecting part needs to be less than double the thickness (about 100 μm) of the existing solder in order that the connecting part has heat resistance at least equivalent to the heat resistance of the existing high-lead solder. Further, in order to fully exhibit the stress relaxation performance of the Al layer, thickness of the Al layer needs to be made as large as possible. Consequently, there is no alternative but to reduce thickness of the Zn layer down to 10 to 20 μm. It was determined that when thickness of the Zn layer is smaller, a surface of an element to be connected needs to adhere to a Zn layer of the Zn/Al/Zn cladding material so as to obtain sufficient connectivity, for which the element to be connected needs to be pressurized with a load of about 2 g/mm2 when being connected. Necessity of pressuring when connecting is also described in Patent Literature 3. If pressurizing is needed when connecting even with a low load applied, the mass production cost increases significantly, and thereby, its application to some products may be difficult.

A conventional connecting method using the Zn/Al/Zn cladding material has a problem in that the cladding material needs to be pressurized when connecting.

Further, the connectivity and the connection reliability can be attained by connecting using a Zn/Al/Zn cladding material described in Patent Literature 3, but a connecting temperature of minimum 382° C. or, in practical use, 390 to 400° C. or more is needed even when Zn—Al eutectic connection is utilized. When cooling down the connecting part connected, a temperature at which the connecting part is finally solidified is 382° C., a melting point of the Zn—Al eutectic phase. Temperature difference between 382° C. and room temperature is very big, i.e. 382-25=357° C. Normally, die bonding in a semiconductor device, for which the Zn/Al/Zn cladding material is used mainly, is performed by connecting a semiconductor element (Si Chip) to a frame made of Cu or Cu alloy to each other. Since a difference in the coefficient of thermal expansion between Si and Cu or Cu alloy is very big, a large temperature difference between the solder's solidifying temperature and room temperature may result in breaking the semiconductor element as a thermal stress generated by the above difference in the coefficient of thermal expansion cannot be reduced. Moreover, when the connecting temperature is high at 390 to 400° C. or more, peripheral members including materials of the Si chip and the frame to be connected need to have heat resistance of at least 400° C. or more, which narrows a selection range of the members to be connected.

Outline of representative aspects of the present invention disclosed herein is briefly described, as follows.

(1) According to one aspect of the present invention, a connecting material comprises an Al layer and first and second Zn layers respectively provided on each of main surfaces of the Al layer, wherein a thickness ratio of the Al layer with respect to the first or the second Zn layer is less than 0.59.

(2) According to another aspect of the present invention, a semiconductor device includes a semiconductor element, a frame, and a connecting part which connects the semiconductor element and the frame to each other, wherein the connecting part comprises Zn—Al alloy, and an interface between the connecting part and the semiconductor element, and an interface between the connecting part and the frame respectively have the area of an Al oxide film which is more than 0% and less than 5% of the respective interface area.

(3) According to a further aspect of the present invention, a method for manufacturing a semiconductor device includes the steps of: placing a connecting material between a first member and a second member, and connecting the first member and the second member to each other by heating and melting the connecting material, wherein the connecting material comprises an Al layer and Zn layers respectively provided on each of main surface of the Al layer, and in the connecting step, connecting is performed by totally melting the Al layer and the Zn layers of the connecting material.

The present invention provides advantageous effects in that bonding can be attained without pressurizing and a connecting material having good stress relaxation properties can be obtained.

These and other objects, features and advantages of the invention will be apparent from the following more particular description of preferred embodiments of the invention, as illustrated in the accompanying drawings.

BRIEF DESCRIPTION OF THE DRAWINGS

FIG. 5 is a view showing an example of a cross section of a connecting material according to an embodiment of the present invention.

FIG. 6 is a table showing thickness of respective layers of a connecting material used in an embodiment of the present invention.

FIG. 9 is a table showing test results on the wettability, stress relaxation performance and necessity of pressurizing when connecting of the semiconductor device shown in FIG. 7, together with those of comparative examples.

FIG. 13 is a table showing test results on the wettability and necessity of pressurizing when connecting of the semiconductor device shown in FIG. 11, together with those of comparative examples.

FIG. 20 is a table showing experiment conditions of connecting materials according to the present invention.

FIG. 23 is a table showing experiment results of a semiconductor device according to the present invention.

FIG. 24 is a table showing experiment results of a semiconductor device according to the present invention.

DESCRIPTION OF THE PREFERRED EMBODIMENTS

Figure 1:
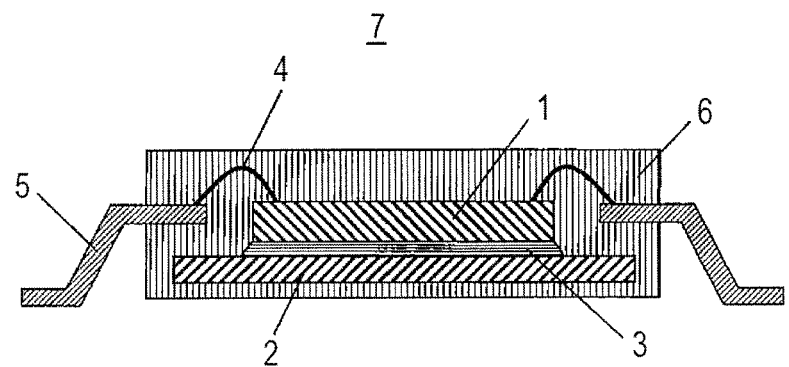
FIG. 1 is a view showing a structure of a conventional semiconductor device.
Figure 2:
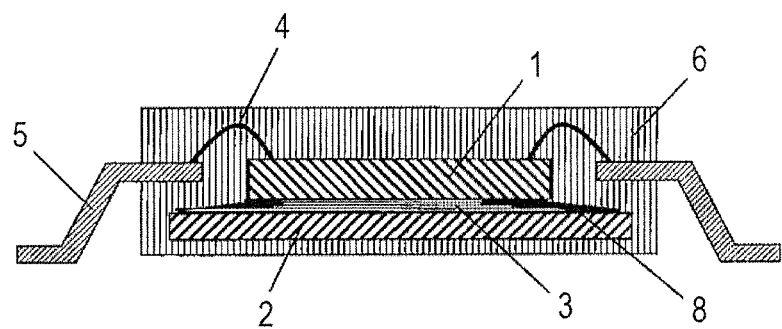
FIG. 2 is a view illustrating a flash which occurred due to re-melting of solder in the semiconductor device shown in FIG. 1.

Hereinafter, embodiments of the present invention are described in detail with reference to the accompanying drawings. In all of the drawings illustrating the embodiments, similar members are denoted with same reference numerals to omit repetition of the description thereof.

FIG. 5 is a view showing an example of a cross section of a connecting material according to an embodiment of the present invention. A Zn layer (hereinafter, also referred to as Zn) 101, an Al layer (hereinafter, also referred to as Al) 102, and a Zn layer (hereinafter, also referred to as Zn layer) 101 are laminated in this order.

Here, thickness of the intermediate Al layer is preferably more than 10 μm and less than 50 μm. As described later, a thickness ratio of the Al layer is preferably larger than a thickness ratio among Zn layer/Al layer/Zn layer of 1:0.52:1.

Since total thickness needs to be at least 48 μm or more in order to ensure the connection reliability, the thickness of the Al layer needs to be at least 10 μm. That is, if the thickness of the Al layer is 10 μm or more, total thickness of the Zn/Al/Zn layers (thickness of a connecting part) becomes 48 μm or more, so that the connection reliability can be ensured. If the thickness of the Al layer is less than 50 μm, the Al layer can be totally dissipated by a reaction between the Zn layer and the Al layer due to thermal load (connecting temperature and connecting time) applied when connecting.

The thickness ratio of the Al layer is preferably larger than the thickness ratio among Zn/Al/Zn layers of 1:0.52 to 0.59:1. If the thickness ratio among Zn/Al/Zn layers is within the above range, Al content of the connecting part becomes 9 mass % or more when Al disappeared completely, whereby the ratio of an Al rich Zn—Al phase in the connecting part becomes more than 20% of a Zn-6Al phase. Accordingly, this prevents growth of cracks and thereby improves stress relaxation properties, that is, the connection reliability. Further, if the thickness of the Al layer is made larger than the thickness ratio of 1:0.59:1, Al content of the connecting part becomes larger than 10 mass %. In this case, the Al layer does not disappear completely at the connecting temperature of 420° C., and therefore there arises a problem that the temperature must be increased further.

Figure 3:
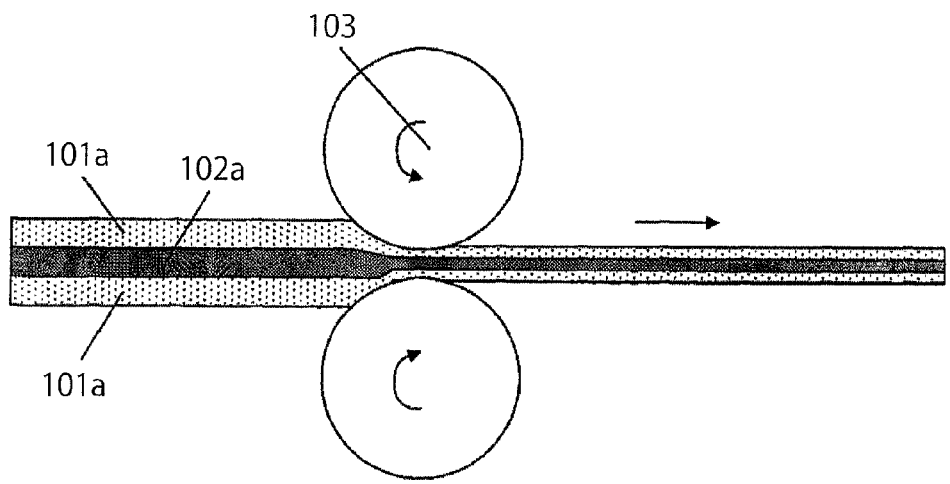
FIG. 3 is a view showing an example of a method for manufacturing a connecting material according to an embodiment of the present invention.

FIG. 3 is a view showing an example of a method for manufacturing a connecting material according to an embodiment of the present invention. The connecting material according to the embodiment of the present invention is manufactured by laminating a Zn layer 101a, an Al layer 102a, and a Zn layer 101a in this order and then rolling or clad-rolling the laminated structure. When rolled with a roller 103, the Zn layer 101a and the Al layer 102a are connected to each other and simultaneously deformed largely by a pressing force. Consequently, oxide films formed on the Zn layer 101a and the Al layer 102a are broken, and both of the layers are metal-bonded via a newly generated surface. In working examples 1 to 30 described below, a connecting material (Zn/Al/Zn cladding material) according to an embodiment of the present invention was fabricated by using the above method.

Figure 4:
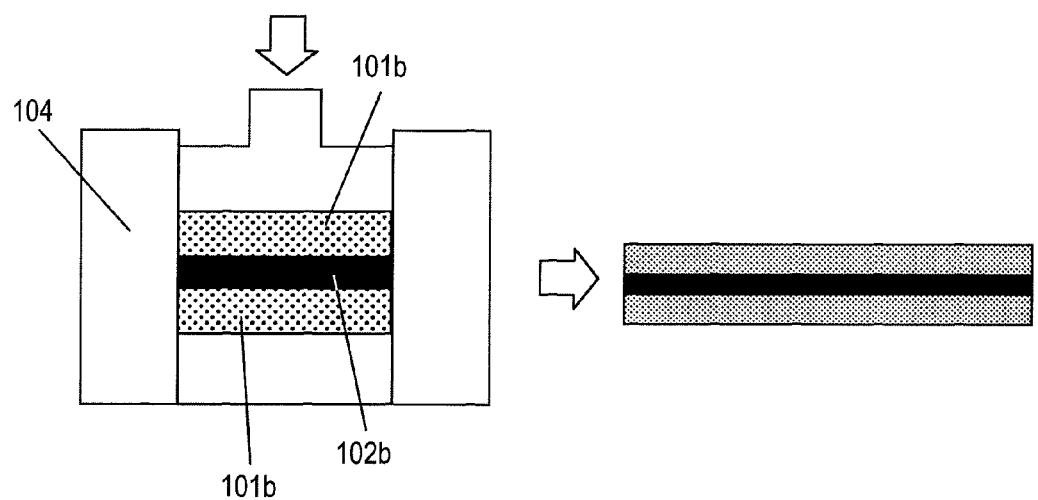
FIG. 4 is a view showing another example of a method for manufacturing a connecting material according to an embodiment of the present invention.

FIG. 4 is a view showing an example of another method for manufacturing a connecting material according to an embodiment of the present invention. The connecting material according to the embodiment of the present invention also may be manufactured by laminating a Zn layer 101b, an Al layer 102b, and a Zn layer 101b in this order and then press-forming the laminated structure. When this laminated material is press-formed by a press-forming machine 104, the Zn layer 101b and the Al layer 102b are connected to each other and simultaneously deformed largely by a pressing force. Consequently, oxide films formed on the Zn layer 101b and the Al layer 102b are broken, and both of the layers are metal-bonded via a newly generated surface. If press-forming is performed in such a manner that thermal load is not applied up to a temperature at which diffusion of Zn and Al becomes remarkable, Al does not reach an outermost surface by diffusing the outer Zn layer, and therefore, good wetting can be obtained when connected.

Using a Zn/Al/Zn cladding material fabricated by the manufacturing method described above, die-bonding in a semiconductor device was performed. Specifically, the semiconductor device includes a semiconductor element, a frame to which the semiconductor element is connected, a lead with one end thereof serving as an external terminal, a wire which connects another end of the lead and an electrode of the semiconductor element to each other, and resin which resin-seals the semiconductor element and the wire, wherein the Zn/Al/Zn cladding material was used to connect the semiconductor element and the frame to each other. When connecting, a thermal load was applied at a connecting temperature of 400° C. or higher for a connecting time of 2 min. or longer such that the Al layer disappears and a whole of the connecting part is melted completely. Since the connecting part as a whole was melted, sufficient wetting could have been obtained without pressurizing. After connected, most of the connecting part comprised Zn—Al—Zn alloy (in some cases, a Zn phase might reside), almost no Al oxide films existed in an interface between the connecting part and the semiconductor device and an interface between the connecting part and the frame, and an area of the Al oxide film existing in respective interfaces was less than 5% of the entire area of respective interfaces. Since Al oxide existing in the interfaces prevents wetting of metals, portions where Al oxide exists were not metal-bonded. Therefore, if the area in which Al oxide exists is less than 5% of the entire interface area, sufficient bonding strength can be obtained.

Further, since most portion of the connecting part comprises Zn—Al alloy (in some cases, Zn phase may reside), a portion having a lowest melting point is Zn-6Al eutectic of 382° C. That is, the connecting part is considered to have heat resistance of 380° C. Further, although the Al layer disappeared, no hard and brittle intermetallic compounds exist in the Zn—Al alloy phase (Zn and Al form no intermetallic compounds), the connecting part has a good stress relaxation properties, that is, a good connection reliability.

In particular, thickness of the Al layer is preferably made larger than the thickness ratio of 1:0.52 to 0.59:1 among Zn/Al/Zn layers of the connecting material such that Al content of the connecting part becomes more than 9 mass % and less than 10 mass % when Al disappeared completely. By making the Al layer thicker than 1:0.52:1, Al content of the connecting part becomes larger than 9 mass % when Al disappeared completely, whereby the ratio of an Al rich Zn—Al phase in the connecting part becomes more than 20% of a Zn-6Al phase, which prevents growth of cracks and thereby improves the stress relaxation properties, that is, the connection reliability. If thickness of the Al layer is made larger than 1:0.59:1, Al content of the connecting part becomes larger than 10 mass %, in which case the Al layer does not disappear completely at a connecting temperature of 420° C., and, therefore, temperature must be increased further.

Similar results also could be obtained when a connecting material (Zn/Al/Zn cladding material) according to an embodiment of the present invention was used for die-bonding of the semiconductor device.

Specifically, the semiconductor device includes a semiconductor element, a substrate to which the semiconductor element is connected, a lead with one end thereof serving as an external terminal, a wire which connects another end of the lead and an electrode of the semiconductor element to each other, and a metal cap which hermetically seals the semiconductor element and the wire, wherein the Zn/Al/Zn cladding material was used to connect the substrate and the metal cap to each other. When connecting, a thermal load was applied at a connecting temperature of 400° C. or higher for a connecting time of 2 min. or longer such that the Al layer disappears and a whole of the connecting part is melted completely. Since the connecting part as a whole was melted, sufficient wetting could have been obtained without pressurizing. After connected, most of the connecting part comprised Zn—Al—Zn alloy (in some cases, a Zn phase might reside), almost no Al oxide films existed in an interface between the substrate and the connecting part and an interface between the connecting part and the metal cap, and an area of the Al oxide film existing in respective interfaces was less than 5% of the entire area of respective interfaces. Thus, sufficient bonding strength can be obtained.

Further, since the connecting part comprises Zn—Al alloy (in some cases, Zn phase may reside), a portion having a lowest melting point is Zn-6Al eutectic of 382° C. That is, the connecting part is considered to have heat resistance of 380° C. Further, although the Al layer disappeared, no hard and brittle intermetallic compounds exist in the Zn—Al alloy phase (Zn and Al form no intermetallic compounds), the connecting part has a good stress relaxation properties, that is, a good connection reliability. In particular, thickness of the Al layer is preferably made larger than the thickness ratio of 1:0.52 to 0.59:1 among Zn/Al/Zn layers of the connecting material such that Al content of the connecting part becomes more than 9 mass % when Al disappeared completely. By making the Al layer thicker than 1:0.52:1, Al content of the connecting part becomes more than 9 mass % and less than 10 mass % when Al disappeared completely, whereby the ratio of an Al rich Zn—Al phase in the connecting part becomes more than 20% of a Zn-6Al phase, which prevents growth of cracks and thereby improves the stress relaxation properties, that is, improves the connection reliability. If thickness of the Al layer is made larger than 1:0.59:1, Al content of the connecting part becomes larger than 10 mass %, in which case the Al layer does not disappear completely at a connecting temperature of 420° C., and, therefore, temperature must be increased further.

Similar results have been obtained when a connecting material (Zn/Al/Zn cladding material) according to an embodiment of the present invention was used.

A connecting material (Zn/Al/Zn cladding material) according to an embodiment of the present invention also may be used for connecting a semiconductor element and a substrate to each other in a semiconductor device. In this case, effects similar to a case where the connecting material is used for die-bonding in a semiconductor device or for connecting a hermetically sealing section in a semiconductor device was obtained.

Embodiment 1

FIG. 6 is a table showing thickness of respective layers of cladding materials (cladding materials 1 to 8) used in this working example. For example, cladding material 1 has a Zn layer of 19 μm in thickness, an Al layer of 10 μm in thickness, and a Zn layer of 19 μm in thickness. Thicknesses of other cladding materials are denoted in a similar manner. Here, cladding materials 1 to 4 represent connecting materials used in the working example of the present invention, while cladding materials 5 to 7 represent connecting materials used as comparative examples.

Zn/Al/Zn cladding materials used in the working example described hereinafter were fabricated by using a method for manufacturing a connecting material shown in FIG. 3 or FIG. 4.

WORKING EXAMPLES 1 to 12

Figure 7:
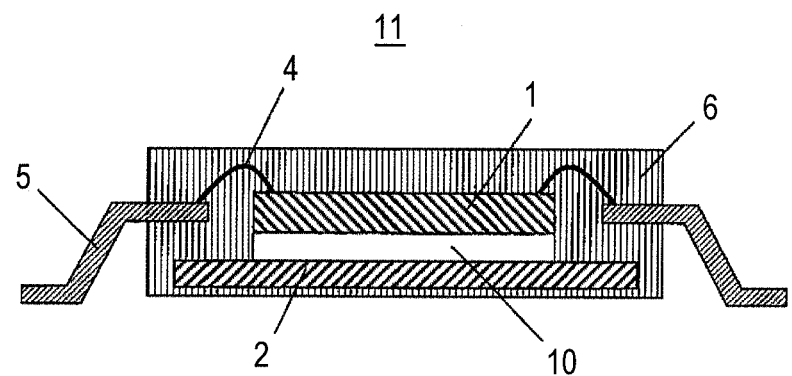
FIG. 7 is a view showing an example of a semiconductor device according to Embodiment 1 of the present invention.

FIG. 7 is a view showing an example of a semiconductor device according to Embodiment 1 of the present invention. A semiconductor device 11 includes a semiconductor element 1, a frame 2 to which the semiconductor element 1 is connected, a lead 5 with one end thereof serving as an external terminal, a wire 4 which connects another end of the lead 5 to an electrode of the semiconductor element 1, and a sealing resin 6 which resin-seals the semiconductor element 1 and the wire 4, wherein the semiconductor element 1 and the frame 2 are connected to each other via a connecting part 10.

A connecting material fabricated by a manufacturing method shown in FIG. 3 or FIG. 4 was placed between the semiconductor element 1 and the frame 2, and the semiconductor device 11 was die-bonded via the connecting part 10 by using the connecting material shown in FIG. 3 or FIG. 4.

Figure 8:
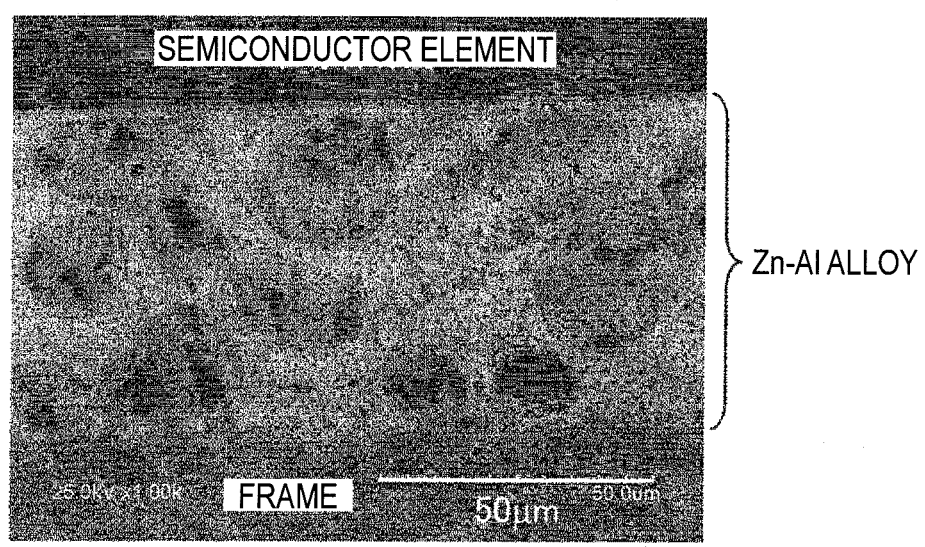
FIG. 8 is a picture showing a cross section of a connecting part formed by a connecting material in the semiconductor device shown in FIG. 7.

Next, a method for manufacturing the semiconductor device 11 shown in FIG. 7 is described. The semiconductor device 11 was manufactured by the steps comprising: placing a connecting material manufactured by a manufacturing method shown in FIG. 3 or FIG. 4 on the frame 2 subjected to Ni, Ni/Ag, or Ni/Au plating, laminating thereon the semiconductor element 1 of 5 mm square in size, and then heating at 400 to 420° C. for 2 to 5 minutes in N2 atmosphere for die bonding without pressurizing. A cross section of the die-bonded connecting part (Zn—Al alloy) 10 is shown in FIG. 8. Since the Al layer of the connecting material (Zn/Al/Zn cladding material) is thick at a thickness of less than 50 μm, the Al layer disappeared by a reaction between Zn and Al due to heating applied when connected, and the connecting part was melted completely. Consequently, the frame 2 and the semiconductor element 1 could be connected without pressurizing. After heating, the connecting part 10 turned to a Zn—Al alloy phase. Thereafter, the semiconductor element 1 and the lead 5 were wire-bonded with the wire 4 and sealed with the sealing resin 6 at 180° C.

Figure 10:
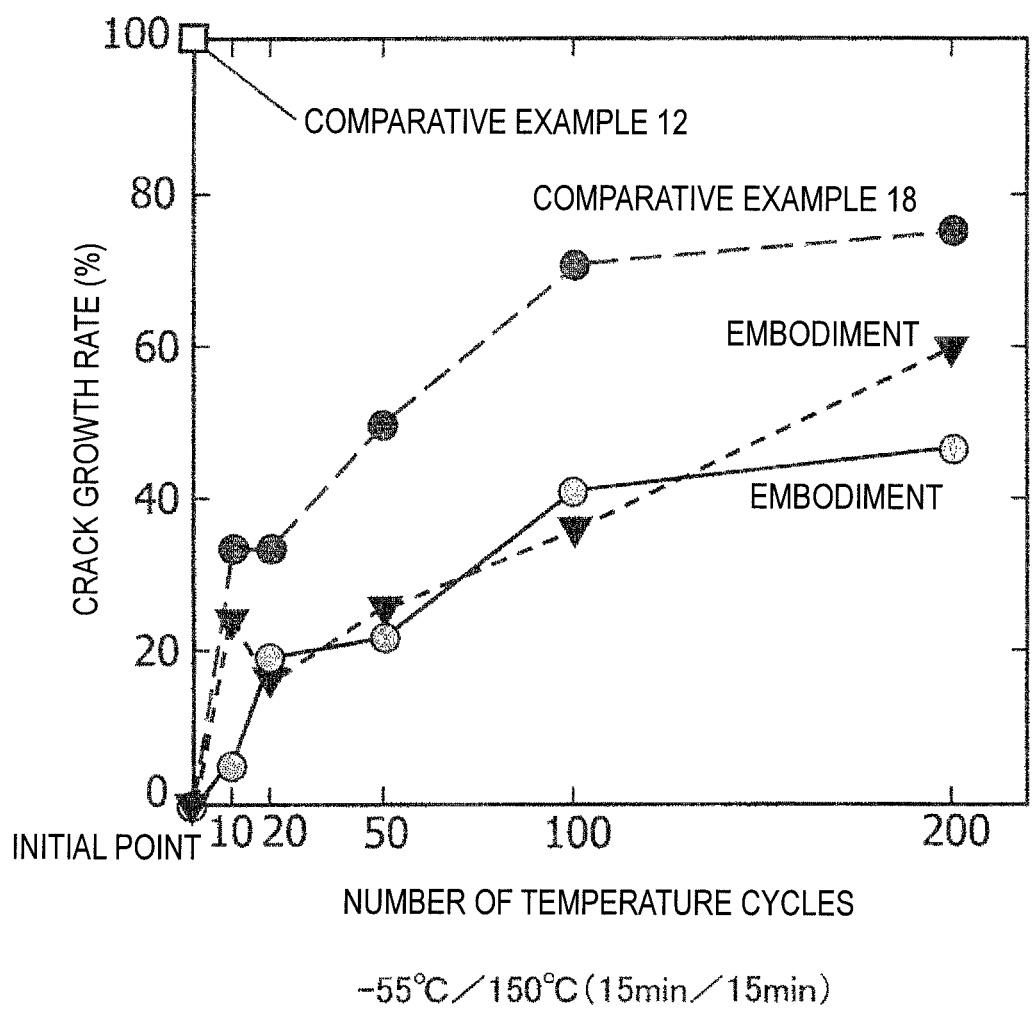
FIG. 10 is a table showing part of temperature cycle test results as a reference for determining results of the stress relaxation performance shown in FIG. 9, together with those of comparative examples.

FIG. 9 is a table showing evaluation results of stress relaxation properties based on the crack growth rate in the cross section of the connecting part at respective numbers of the temperature cycle test performed at −55° C./150° C. (15 min/15 min). The test was conducted on the wettability in die-bonding and the die-bonding itself only for each of the cladding materials 1 to 4 shown in FIG. 4. Part of temperature cycle test results as a reference for evaluating results of the stress relaxation performance shown in FIG. 9 is shown in FIG. 10 along with those of comparative examples 1 to 18.

Evaluation result of the wettability was classified to three ranks including "○" which represents a wetting of 90% or more with respect to the area (25 mm²) of the semiconductor element, "Δ" which represents an wetting of more than 75% and less than 90%, and "X" which represents an wetting of less than 75%. Evaluation result of the stress relaxation performance was classified to three ranks including "○" which represents a crack growth ratio lower than the existing Pb-1.5Ag-5Sn solder, "Δ" which represents a crack growth ratio lower than 125% of the existing Pb-1.5Ag-5Sn solder, and "X" which represents a crack growth ratio higher than 125% of the Pb-1.5Ag-5Sn solder. "-" indicates that the connecting material could not be connected, and therefore, evaluation of the temperature cycle test, i.e., the stress relaxation performance, was not available.

According to the evaluation results, a wettability of 90% or more could be obtained when connected by using the connecting material of cladding materials 1 to 4 (Zn/Al/Zn). For the stress relaxation performance, cladding material 1, which is thin with a total thickness of 50 μm, exhibited a crack growth rate of 100 to 125% relative to the existing Pb-1.5Ag-5Sn solder and therefore was ranked as "Δ", while each of the cladding materials 2 to 4 exhibited a crack growth rate lower than the existing Pb-1.5Ag-5Sn solder and therefore was ranked as "○".

On the other hand, comparative examples 1 to 9 (cladding materials 5 to 7 shown in FIG. 6) needed to make a connecting surface of a member to be connected and a Zn layer of the Zn/Al/Zn cladding material adhere to each other to get sufficient connectivity, for which the cladding materials needed to be pressurized with a load of 1.75 g/mm² when connecting. Any of the test pieces thus fabricated exhibited "○" ranked wettability and stress relaxation performance.

For comparative examples 10 to 12 (Zn-6Al-5Ge), since a rigid Al oxide film was formed on the surface of a melted Zn—Al alloy, each of the comparative examples exhibited an wetting of less than 75% relative to the frame. Consequently, almost no wetting was available, and therefore the stress relaxation performance could not be evaluated. For comparative examples 13 to 15 (Zn), wetting of 90% or more could be obtained by making connection at a temperature of 420° C., a melting point of Zn, or higher. However, some semiconductor elements were broken due to failure of alleviating thermal stress because of a difference in the coefficient of thermal expansion between the semiconductor element and the frame made of Cu during cooling after connected. Examples, which averted the breakdown, were subjected to the temperature cycle test. As a result, breakdown of semiconductor elements has occurred. For comparative examples 16 to 18 (existing Pn-1.5Ag-5Sn), both the wettability and the stress relaxation performance were ranked as "○". Although, in this review, a load of 0.02 g/mm2 was applied when connecting, connecting can be attained without pressurizing. However, the comparative materials comprise lead of 93.5 mass %.

As described above and according to working examples 1 to 12, it was found that when a connecting material (shown in FIG. 3 or FIG. 4) according to an embodiment of the present invention was used for die-bonding of the semiconductor device 11, a thin Al layer having a thickness lower than 50 μm disappears in a reaction between Zn and Al during heating applied when connected, whereby the connecting part is melted completely and connecting can be attained without pressurization.

WORKING EXAMPLES 13 TO 24

Figure 11:
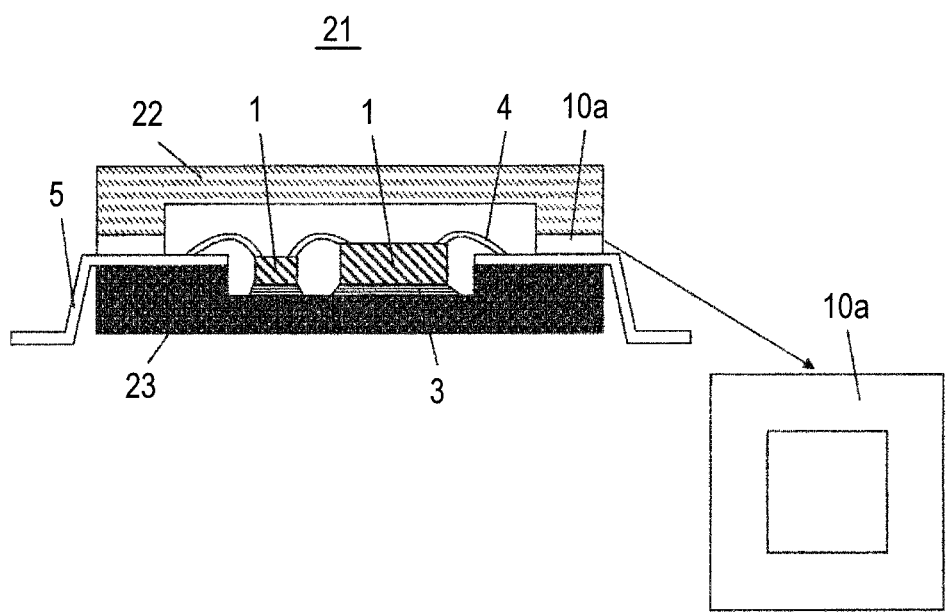
FIG. 11 is a view showing an example of a semiconductor device according to an embodiment of the present invention.

FIG. 11 is a view showing an example of a semiconductor device according to an embodiment of the present invention. As shown in FIG. 11, working examples 13 to 24 are connected by using a connecting material shown in FIG. 3 or FIG. 4 as a sealing material of the semiconductor device 21 which requires hermetical sealing. The semiconductor device 21 includes a semiconductor element 1, a module substrate 23 to which the semiconductor element 1 is connected, a lead 5 with one end thereof serving as an external terminal, and a wire 4 which connects another end of the lead 5 and an electrode of the semiconductor 1, wherein the semiconductor 1 and the wire 4 were hermetically sealed, the semiconductor element 1 and the chip components were connected to the module substrate 23 by using an Sn-based lead-free solder 3, a conductive adhesive, a Cu powder/Sn-based solder powder composite, or the like, and a connecting material 10a was placed between the module substrate 23 and the metal cap 22 and connected by heating at 400 to 420° C. for 2 to 5 minutes without pressurizing. Since the thickness of the Al layer in the connecting material (Zn/Al/Zn cladding material) is thin below 50 μm, the Al layer disappeared by a reaction between Zn and Al due to heating applied when connected. Consequently, connecting could be attained without pressurizing. After heating, the connecting part 10a turned a Zn—Al alloy phase.

Figure 12:
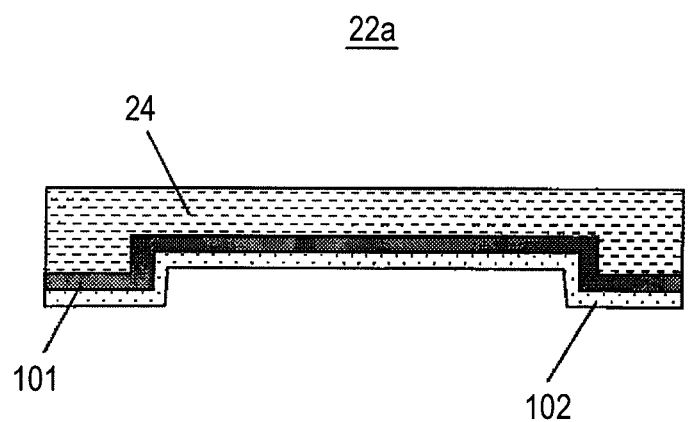
FIG. 12 is a view showing a metal cap which is integrated into the connecting material in the semiconductor device shown in FIG. 11.

The metal cap may be fabricated as a metal cap integrated connecting material 22a by clad-rolling a metal alloy 24 such as cover and invar with the Al layer 102 and the Zn layer 101 as shown in FIG. 12.

Evaluation results of the wettability of working examples 13 to 24 (cladding materials 1 to 4 shown in FIG. 6) when sealed are shown in FIG. 13. Evaluation results of the wettability were classified to two ranks including "○" which represents a wetting sufficient to maintain air-tightness relative to a sealing area, and "X" which represents an wetting which is not enough to maintain air-tightness due to a void, a crack, or the like. According to the evaluation results, an wettability of 90% or more could be obtained when connected by using connecting materials of cladding materials 1 to 4 (Zn/Al/Zn).

On the other hand, comparative examples 19 to 24 (cladding materials 5 and 6 shown in FIG. 6) need to make a surface of a material to be connected and a Zn layer of the Zn/Al/Zn cladding material adhere to each other to obtain sufficient connectivity, and for which purpose, the cladding material needed to be pressurized with a load of 1.75 g/mm$^2$ when connecting. All of test pieces thus fabricated exhibited a wettability of "○". Comparative examples 25 to 27 (Zn-6Al-5Ge) could not be hermetically sealed due to insufficient wetting and voids since rigid Al oxide film was formed on a surface of a melted Zn—Al alloy.

As described above, working examples 13 to 24 demonstrate that by using the connecting material 10a according to this embodiment as a sealant of the semiconductor device 21, a thin Al layer of 50 μm in thickness causes Zn and Al to react with each other due to heating applied when connecting, and thereby the Al layer disappears and the connecting part is melted completely, so that connecting can be attained without pressurizing.

Embodiment 2

Figure 14:
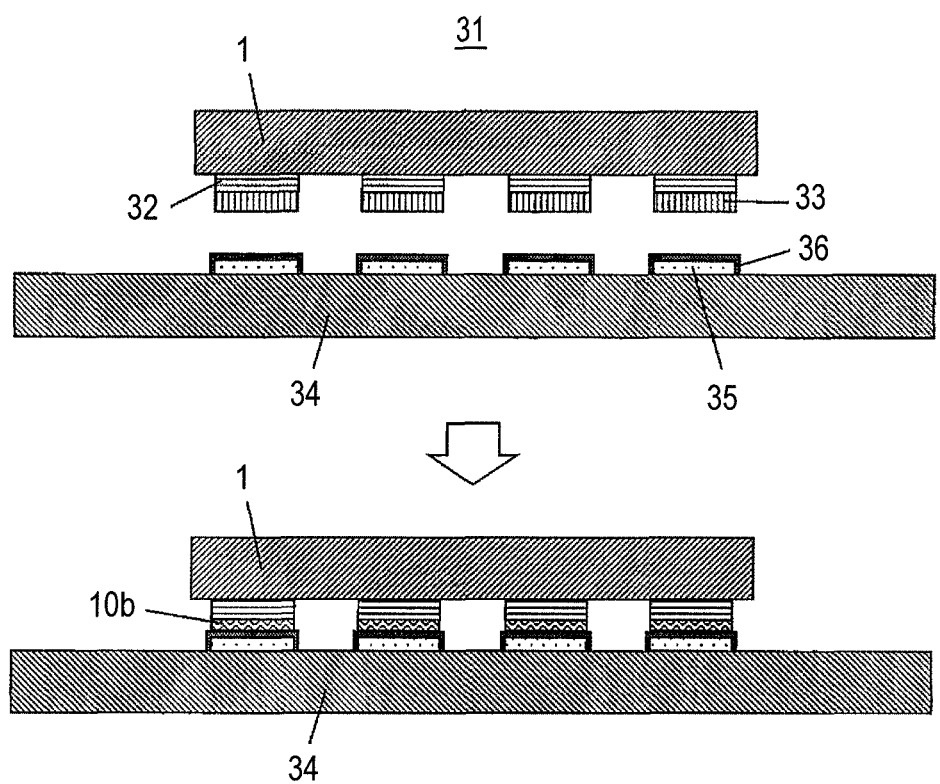
FIG. 14 is a view showing a connecting material used as a bump of a semiconductor device, according to an embodiment of the present invention.
Figure 15:
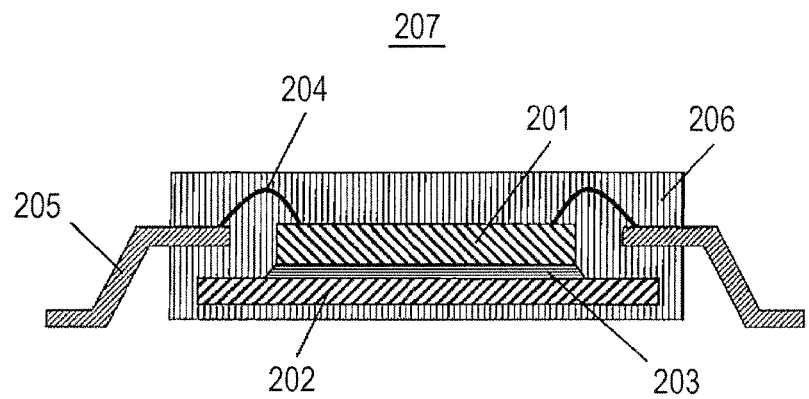
FIG. 15 is a view showing an example of a structure of a semiconductor device connected by using a conventional high-lead solder.
Figure 16:
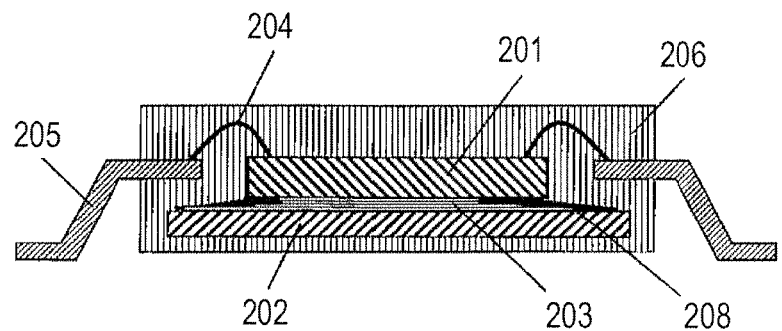
FIG. 16 is a view illustrating a flash which occurred due to re-melted solder in the semiconductor device shown in FIG. 15.

FIG. 14 is a view showing a connecting material (shown in FIG. 3 or FIG. 4) according to an embodiment of the present invention used as a bump 10 of a semiconductor device 31 which needs a flip-chip mounting. The semiconductor device 31 includes a semiconductor element 1 and a substrate 34 on which the semiconductor element 1 is mounted, wherein the semiconductor element 1 and the substrate 34 are connected to each other via a connecting material 10b.

The semiconductor device 31 was manufactured by placing the connecting material 10b between a pad of a substrate 34 with a Cu wire 35 subjected to Ni or Ni/Au plating 36 and an electrode of the semiconductor element 1 with an Al wire 32 subjected to Zn plating 33, and then connecting at 380° C. without pressurizing.

In other working examples, connecting without pressurizing also can be attained by using the connecting material 10b according to this embodiment as a bump of the semiconductor device 31.

Embodiment 3

Figure 19:
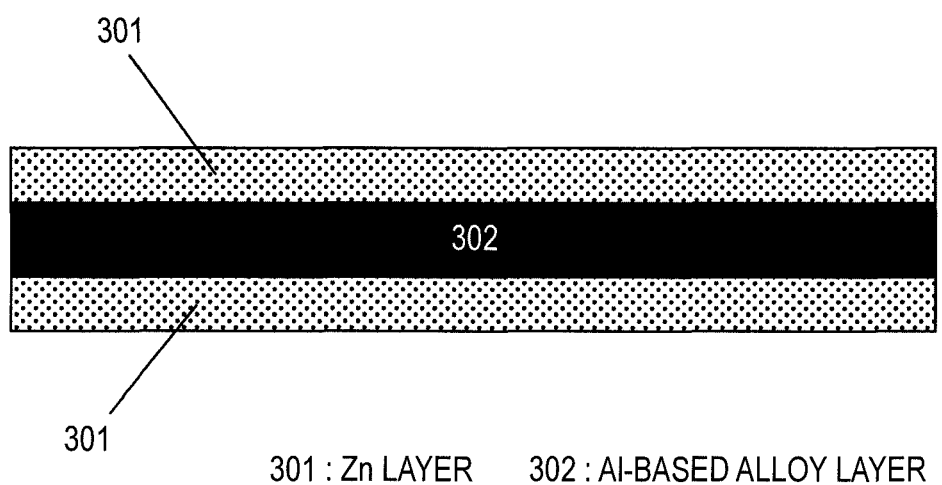
FIG. 19 is a view showing an example of a cross section of a connecting material according to the present invention.

FIG. 19 is a view showing an example of a cross section of a connecting material according to the present invention. The connecting material comprises a Zn layer 301 and an Al-based alloy layer 302 and is formed by laminating the Zn layer (also simply referred to as Zn) 301, the Al-based alloy layer (also simply referred to as Al-based alloy) 302, and the Zn layer (also simply referred to as Zn) 301 in this order. Here, since the intermediate Al-based alloy layer comprises one or more metals selected from the group comprising of Mg, Sn, Ge, Bi and In, a Zn—Al based alloy having a melting point lower than 350° C. is formed when the Al-based alloy reacts with Zn. When the Al-based alloy layer contains Mg, Mg content is preferably 20 to 50 mass %. Further, when the Al-based alloy layer contains Sn in addition to Mg, Sn content is preferably 20 to 50 mass %. With an Al-based alloy layer having such a composition, Zn—Al—Mg based alloy, Zn—Al—Mg—Sn based alloy, Zn—Al—Mg—Ge based alloy, or the like having a low melting point can be formed at the connecting part.

Figure 17:
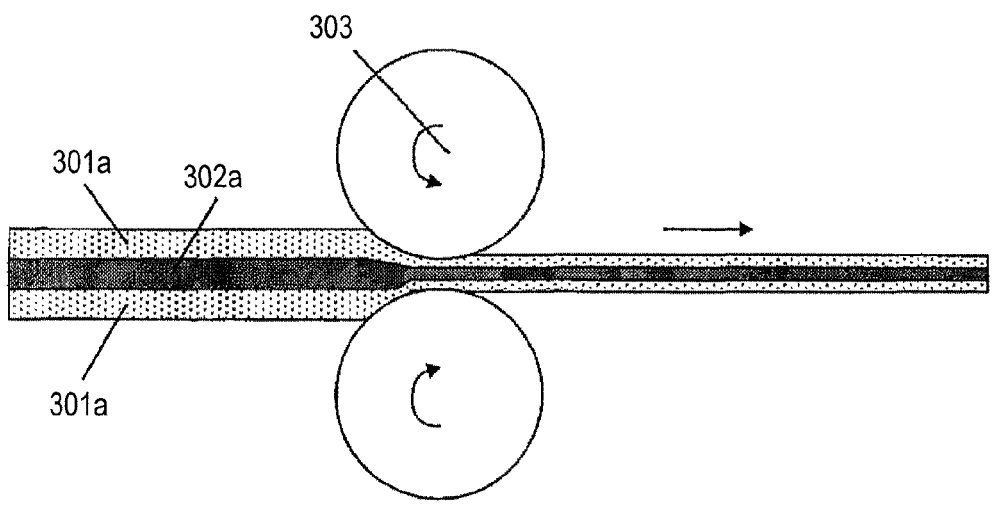
FIG. 17 is a view showing a method of clad-rolling.

FIG. 17 is a view illustrating a method of clad-rolling for manufacturing a connecting material according to the present invention. Here, 301a, 302a and 301a represent a Zn layer, an Al-based alloy layer and a Zn layer respectively. Those layers are laminated and rolled by a roller 303, that is, clad-rolling is performed. When rolled using the roller 303, the Zn layer 301 and the Al-based alloy layer 302a are connected to each other and simultaneously deformed largely by a pressing force. Consequently, oxide films formed on the surface of the Zn layer 301a and the Al-based alloy layer 302a are broken, and both of the layers are metal-bonded via a newly generated surface.

Figure 18:
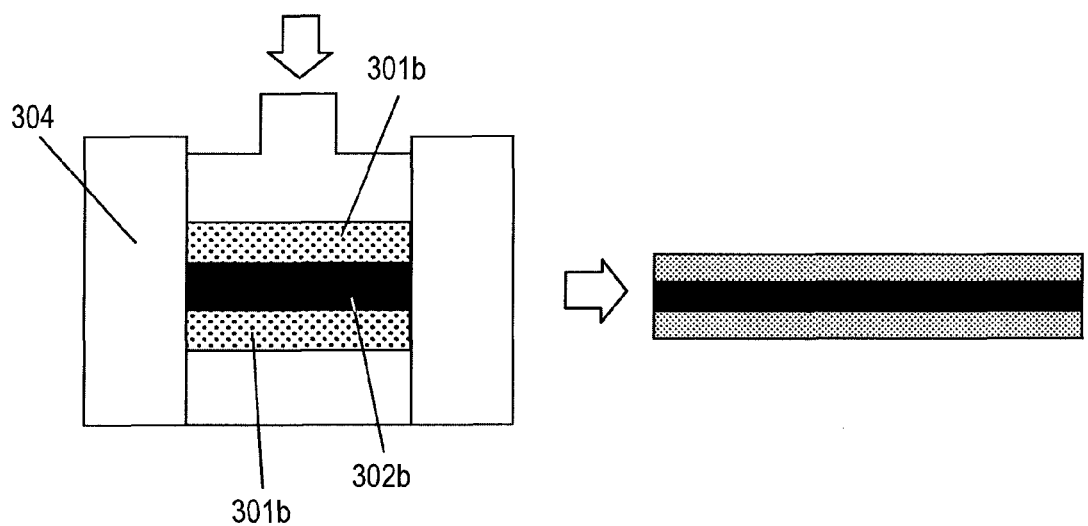
FIG. 18 is a view showing a method of press-forming.

FIG. 18 is a view illustrating a method of press-forming for manufacturing a connecting material according to the present invention. Here, 301b, 302b and 301b represent a Zn layer, an Al-based alloy layer and a Zn layer respectively. Those layers are laminated and press-formed by using a press-forming machine 304. When press-formed using the press-forming machine 304, the Zn layer 301b and the Al-based alloy layer 302b are connected to each other and simultaneously deformed largely by a pressing force. Consequently, oxide films formed on the surface of the Zn layer 301b and the Al-based alloy layer 302b are broken, and both of the layers are metal-bonded via a newly generated surface. If press-forming is performed in such a manner that thermal load is not applied up to a temperature at which diffusion of Zn and Al alloys becomes remarkable, components of the Al-based alloy do not reach the outermost surface by diffusing the outer Zn layer, and therefore, a good wetting can be obtained when connected.

Figure 21:
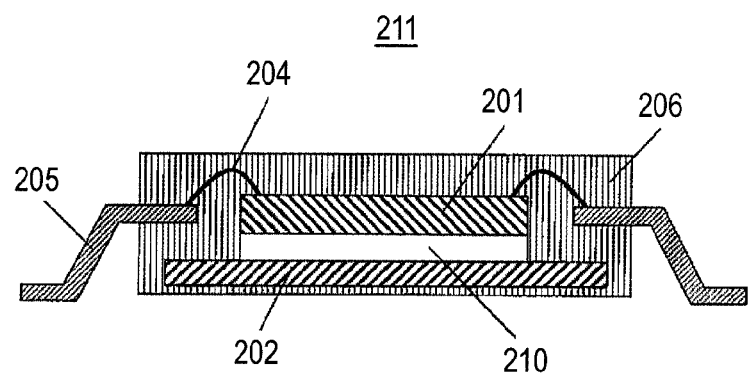
FIG. 21 is a view showing an example of a cross section of a semiconductor device connected by using a connecting material according to the present invention.
Figure 22:
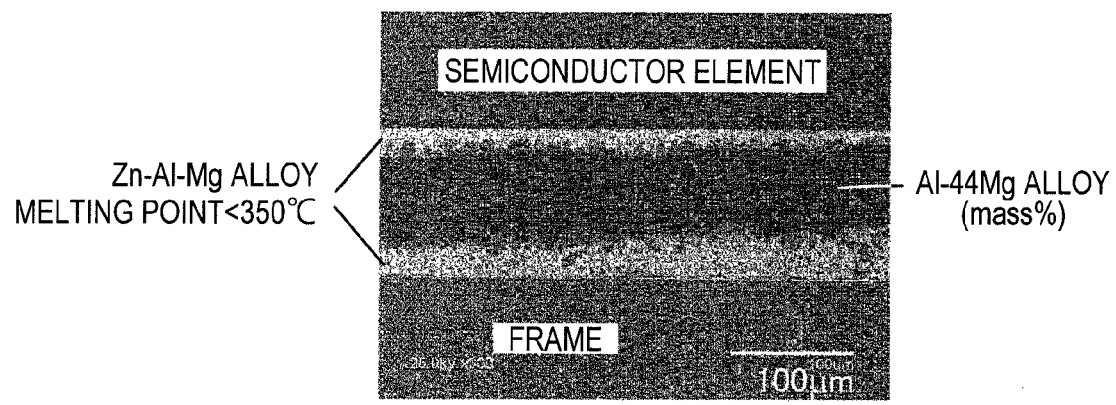
FIG. 22 is a picture showing a cross section of a connecting part formed by a connecting material according to the present invention.

FIG. 21 is a view showing an example of a semiconductor device connected by using a connecting material according to the present invention. Using a Zn/Al-based alloy/Zn cladding material fabricated by a manufacturing method shown in FIG. 17 or FIG. 18, die-bonding in a semiconductor is performed. Specifically, a semiconductor devices 211 includes a semiconductor element 201, a frame 202 connected to the semiconductor element via a connecting material 210, a lead 205 with one end thereof serving as an external terminal, a wire 204 which connects another end of the lead 205 and an electrode of the semiconductor element 201 to each other, and a resin 206 which resin-seals the semiconductor element 201 and the wire 204, wherein the Zn/Al-based alloy/Zn cladding material fabricated by the manufacturing method shown in FIG. 17 or FIG. 18 was used to connect the semiconductor element 201 and the frame 202 to each other.

When connected to each other, the Al-based alloy layer and the Zn layer of the Zn/Al-based alloy/Zn cladding material react to each other, whereby the connecting part turns a Zn—Al—Mg based alloy, or the like. Since a melting point of the alloy is lower than 350° C., connecting can be attained at a low temperature of 350° C. by an eutectic connection of the Zn—Al—Mg based alloy or the like. Further, the semiconductor element is not broken during cooling after connected. Further, since the connecting part comprises Zn—Al—Mg based alloy or the like, the melting point goes down below 350° C., but remains at least higher than 300° C. Therefore, the connecting part has heat resistance of 300° C., which is sufficient to fully withstand reflow soldering at 260° C. in a downstream process. Further, this manufacturing method also provides an effect that good connecting reliability can be obtained owing to stress relaxation performance of the intermediate Al-based alloy layer.

A method for manufacturing the semiconductor device 211 is described. A connecting material is provided onto the frame subjected to Ni, Ni/Ag or Ni/Au plating, and the semiconductor element 201 having a size of 5 mm square is laminated thereon. Then, the laminated structure is die-bonded in N2 atmosphere at 350° C. for 2 minutes while being pressurized, to connect the semiconductor element 1 and the frame 2 to each other via solder 10. FIG. 8 is a view showing a cross section of a connecting part of the semiconductor device 1 connected via solder. Zn and Al-based alloys react to each other by heating applied when connecting, so that connecting can be attained at a low temperature of 350° C., and after connected, the connecting part turns a Zn—Al—Mg based alloy phase or the like. Thereafter, the semiconductor device 1 and the lead 5 are connected to each other by wire-bonding with the wire 4, and sealed with the sealing resin 6 at 180° C.

Figure 25:
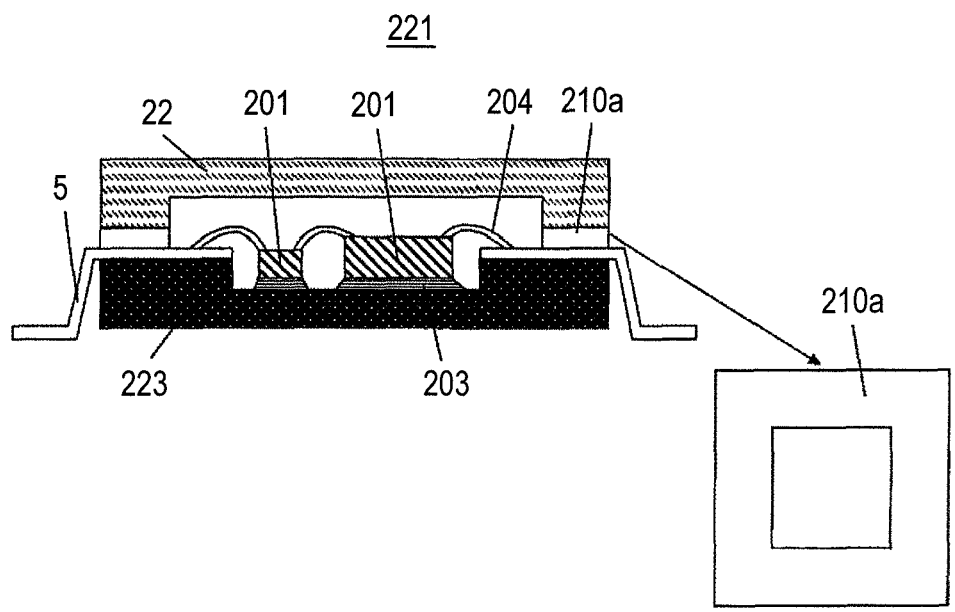
FIG. 25 is a view showing an example of a metal cap which is integrated into a connecting material in the semiconductor device shown in FIG. 24.
Figure 26:
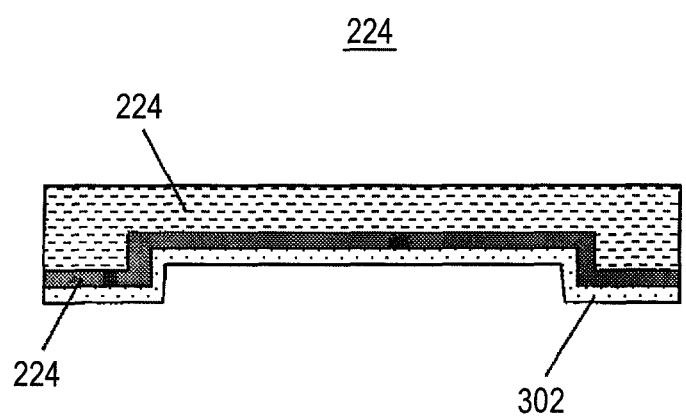
FIG. 26 is a view showing an example of a cross section of a semiconductor device connected by using a connecting material according to the present invention.

FIG. 25 is a configuration diagram of a semiconductor device 221 in which a Zn/Al-based alloy/Zn cladding material according to the present invention was used for connecting and die-bonding a hermetically sealing section in the semiconductor device.

Specifically, the semiconductor device 221 includes a semiconductor element 201, a substrate 223 which is connected to the semiconductor element 201 via a Zn/Al-based alloy/Zn cladding material according to the present invention, a lead 205 with one end thereof serving as an external terminal, a wire 204 which connects another end of the lead 205 and an electrode of the semiconductor element 201, and a metal cap 222 which hermetically seals the semiconductor device 201 and the wire 204 and is connected to the substrate 223, wherein the Zn/Al-based alloy/Zn cladding material according to the present invention was used to connect the substrate 223 and the metal cap 222 to each other.

When connecting, the Al-based alloy layer and the Zn layer of the Zn/Al-based alloy/Zn cladding material react to each other, whereby the connecting part turns a Zn—Al—Mg based alloy, or the like. Since a melting point of the alloy is lower than 350° C., connecting can be attained at a low temperature of 350° C. by an eutectic connection of the Zn—Al—Mg based alloy or the like. Further, no cracks occur at the connecting part of the semiconductor device connected according to this embodiment. Further, since the connecting part comprises Zn—Al—Mg based alloy or the like, the melting point goes down below 350° C., but remains at least higher than 300° C. Therefore, the connecting part has heat resistance of 300° C., which is sufficient to fully withstand reflow soldering at 260° C. in a downstream process. Further, this manufacturing method also provides an effect that good connection reliability can be obtained owing to stress relaxation performance of the intermediate Al-based alloy layer. Similar effects also can be obtained in a semiconductor device connected by die-bonding with the connecting material according to the present invention.

The semiconductor device 221 shown in FIG. 25 is manufactured by using a connecting material according to the present invention as a sealant for hermetical sealing. Hereinafter, a method for manufacturing the semiconductor device 221 is described. The method comprises the steps: hermetically sealing the semiconductor element 201 and the wire 204, connecting the semiconductor element 201, the chip part, and the like to the substrate 223 by using Sn-based lead-free solder 203, a conductive adhesive, Cu powder/Sn based solder powder composite material, or the like, placing the connecting material 210a between the substrate 223 and the metal cap 222, and connecting by heating the connecting material 210a at 350° C. for 2 minutes while pressurizing. Zn and Al-based alloy react to each other by heating applied when connecting, so that connecting can be attained at a low temperature of 350° C. After connected, the connecting part turns to a Zn—Al—Mg based alloy phase or the like.

The metal cap 222 may be fabricated as a metal cap integrated connecting material 222a by clad-rolling a metal alloy 224 such as cover and invar with the Al-based alloy layer 102 and the Zn layer 301 as shown in FIG. 25.

Further, a Zn/Al-based alloy/Zn cladding material according to the present invention also may be used for connecting the semiconductor element 201 and the substrate 223 in the semiconductor device 221. Specifically, the semiconductor device 221 may include the semiconductor element 201 and the substrate 223 which is connected to the semiconductor element 201 via solder 203 connected using a connecting material according to the present invention.

When connecting, the Al-based alloy layer and the Zn layer of the Zn/Al-based alloy/Zn cladding material react to each other, whereby the connecting part turns to a Zn—Al—Mg based alloy, or the like. Since a melting point of the alloy is lower than 350° C., connecting can be attained at a low temperature of 350° C. by an eutectic connection of the Zn—Al—Mg based alloy or the like. Further, the semiconductor element is not broken and no cracks occur at the connecting part during cooling after connected. Further, since the connecting part comprises Zn—Al—Mg based alloy or the like, the melting point goes down below 350° C., but remains at least higher than 300° C. Therefore, the connecting part has heat resistance of 300° C., which is sufficient to fully withstand reflow soldering at 260° C. in a downstream process. Further, this manufacturing method also provides an effect that good connection reliability can be obtained owing to stress relaxation performance of the intermediate Al-based alloy layer.

FIG. 20 is a table showing experiment conditions of connecting materials according to the present invention, including the thickness, the composition of Al alloy layer and the remarks of cladding materials 8 to 20 fabricated by the method described above. Cladding material 8 has a Zn layer of 20 μm in thickness, an Al layer of 40 μm in thickness, and a Zn layer of 20 μm in thickness. Thicknesses of cladding materials 9 to 19 are also denoted in a similar manner. As an Al-based alloy layer, four types of alloy layers including Al-44Mg, Al-34Mg-23Sn, Al-27Mg-36Ge, and Al were used. Here, cladding materials 8 to 16 are connecting materials according to the present invention, while cladding materials 17 to 19 are connecting materials used for comparison. In working examples described below, all of the Zn/Al-based alloy/Zn cladding materials were fabricated using the clad-rolling method shown in FIG. 17.

FIG. 23 is a table showing experiment results of the wettability and existence or non-existence of chip cracking after connecting in a semiconductor device connected by using a connecting material according to the present invention. Working examples 25 to 51 show the wettability and chip cracking after connecting when semiconductor devices were manufactured by die-bonding with cladding materials which are connecting materials according to the present invention. Comparative examples 28 to 36 show the wettability and chip cracking after connecting when semiconductor devices were manufactured by die-bonding respectively with cladding materials 17 to 19 whose composition of the Al-based alloy layer is Al.

Evaluation results of the wettability were classified to three ranks including "○" which represents an wettability of 90% or more with respect to the area (25 mm$^2$) of the semiconductor element, "Δ" which represents an wettability of less than 90% and more than or equal to 75%, and "X" which represents an wettability of less than 75%.

As a result of the experiments, for working examples 25 to 51, which used cladding materials 8 to 16, any cladding material with any type of frame plating exhibited an wettability of more than 90%. Similarly, all cladding materials with any type of frame plating exhibited no chip cracking after connected.

On the other hand, for comparative examples 28 to 36, which used cladding materials 17 to 19, all of comparative examples 28 to 36 exhibited a wettability of more than 90% similarly with working examples 25 to 51. However, chip cracking after connecting occurred in all of the comparative examples. It is considered that high solidification temperature of comparative examples 28 to 36 in the connecting part being 382° C. (melting point of Zn-6Al) is attributable to the occurrence of chip cracking.

As described above, it was determined from working examples 25 to 51 that connecting can be attained at a low temperature of 350° C. by using connecting materials according to the present invention for die-bonding of the semiconductor device, whereby thermal stress generating during cooling after connection can be reduced and breakdown of the semiconductor element can be prevented.

FIG. 24 is a table showing experiment results of the wettability and existence or non-existence of chip cracking after connection in the semiconductor device 221 shown in FIG. 25 connected by using connecting materials according to the present invention. Working examples 52 to 69 show the wettability and chip cracking after connection for the semiconductor device 221 connected by using cladding materials which are connecting materials according to the present invention. Comparative examples 37 to 42 show the wettability and chip cracking after connecting for a semiconductor device manufactured by connecting with either cladding material 210 or 211 whose composition of the Al-based alloy layer is Al.

Evaluation results of the wettability were classified to two ranks including "○" which represents an wettability sufficient to maintain air tightness with respect to the sealing area, and "X" which represents failure of maintaining air tightness due to a void, a crack, or the like.

As a result of the experiments, for working examples 52 to 69, which used cladding materials 8 to 13, any cladding material with any type of frame plating exhibited an wettability of more than 90%. Similarly, all cladding materials with any type of frame plating also exhibited no chip cracking in the connecting part after connection.

On the other hand, for comparative examples 37 to 42, which used either cladding material 210 or 211, all of comparative examples 37 to 42 exhibited a wettability of more than 90% similarly with working examples 52 to 69. However, chip cracking after connecting occurred in all of the comparative examples. It is considered that high solidification temperature of comparative examples 37 to 42 in the connecting part being 382° C. (melting point of Zn-6Al) is attributable to the occurrence of chip cracking.

As described above, it was determined from working examples 52 to 69 that connecting can be attained at a low temperature of 350° C. by using a connecting material according to the present invention as a sealant of the semiconductor device, whereby thermal stress generating during cooling after connection can be reduced and occurrence of cracks after connection can be prevented.

Figure 27:
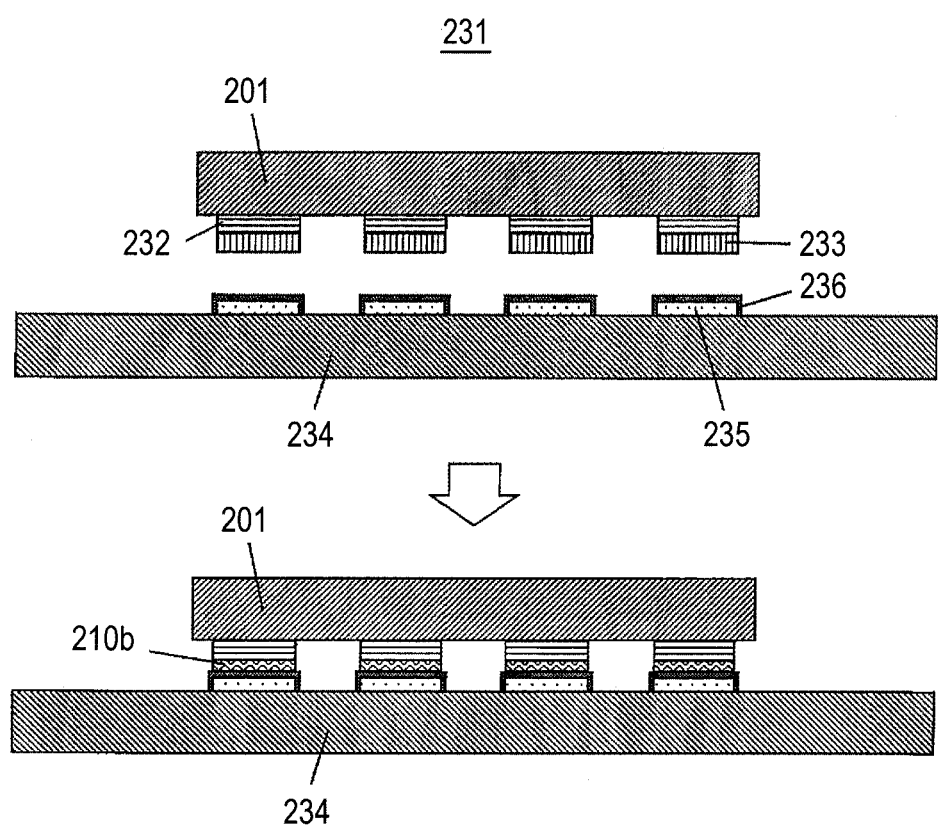
FIG. 27 is a view showing an example of a cross section and a mounted structure of a semiconductor device connected by using a connecting material according to the present invention.

FIG. 27 is a view showing another embodiment of a semiconductor device connected by using a connecting material according to the present invention. The semiconductor device 231 is connected using the connecting material 210b according to the present invention as a bump of a semiconductor device which needs flip-chip mounting. The semiconductor device 231 includes a semiconductor element 201 and a substrate 234 on which the semiconductor element 201 is mounted, wherein the semiconductor element 201 and the substrate 234 are connected to each other by the connecting material 210b.

Hereinafter, a method for manufacturing the semiconductor device 231 is described. The connecting material 210b was placed between a pad of the substrate 234 with a Cu wire subjected to Ni or Ni/Au plating and an electrode of the semiconductor element 201 with the wire 232 subjected to Zn plating, and connecting was performed while pressurizing at 350° C.

In other embodiments, connecting also can be attained at a low temperature of 350° C. by using the connecting material 210b according to the present invention as a bump of the semiconductor device, and, thereby, thermal stress after connecting can be reduced and breakdown of the semiconductor device or cracking in the bump can be prevented.

As above, the present invention provided by the inventors has been described in connection with the preferred embodiments. However, the invention is not limited to the above embodiments. It will be apparent to those skilled in the art that other various modifications, improvements, combinations and the like can be made without departing from the spirit thereof.

That is, although application of the present invention has been described by citing the die-bonding of a semiconductor device, the present invention may be applied to various semiconductor devices which need die-bonding. Such semiconductor devices include, for example, an alternating diode, front-end modules such as an IGBT module and an RF module, a vehicle power module, and the like.

Further, although the preferred embodiments have been described above by citing a case where a semiconductor device is reflow soldered on a module substrate, the present invention may be applied to a case where a semiconductor device is used for a MCM (Multi Chip Module) configuration.

A semiconductor device according to the present invention may be utilized as a semiconductor device for a power device, a power transistor, a power module, LSI, and the like, and in particular, as a semiconductor device which needs a lead-free bonding part for die-bonding, hermetic sealing, flip-chip bonding, and the like.

The present invention provides advantageous effects in that bonding can be attained without pressurizing and a connecting material having good stress relaxation properties can be obtained.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

REFERENCE SIGNS LIST

1 . . . Semiconductor Element
2 . . . Frame
3 . . . Solder
4 . . . Wire
5 . . . Lead
6 . . . Resin
7 . . . Semiconductor Device
8 . . . Void
10, 10a, 10b . . . Connecting Material 11 ... Semiconductor Device
21 ... Semiconductor Device
22, 22a ... Metal Cap
23 ... Module Substrate
24 ... Metal Alloy
31 ... Semiconductor Device
32 ... Al WIRE
33 ... Zn Plating
34 ... Substrate
35 ... Cu Wire
36 ... Ni OR Ni/Au Plating
101 ... Zn Layer
102 ... Al Layer
103 ... Roller
104 ... Press-Forming Machine
201 ... Semiconductor Element
202 ... Frame
203 ... Solder
204 ... Wire
205 ... Lead
206 ... Resin
207 ... Semiconductor Device
208 ... Void
210, 210a, 210b ... Connecting Material
211 ... Semiconductor Device
221 ... Semiconductor Device
222, 222a ... Metal Cap
223 ... Module Substrate
224 ... Metal Alloy
231 ... Semiconductor Device
232 ... Al-Based Alloy Wire
233 ... Zn Plating
234 ... Substrate
235 ... Cu Wire
236 ... Ni OR Ni/Au Plating
301 ... Zn Layer
302 ... Al-Based Alloy Layer
303 ... Roller
304 ... Press-Forming Machine

The invention claimed is:

1. A connecting member, comprising:
an Al-based layer, and
first and second Zn-based layers respectively provided on main surfaces of the Al-based layer,
wherein a thickness ratio of the Al-based layer with respect to the first and second Zn-based layers is less than 0.59.

2. The connecting member according to claim 1, wherein the thickness ratio of the Al-based layer with respect to the first and second Zn-based layers is more than 0.52.

3. The connecting member according to claim 1, wherein a thickness of the Al-based layer is more than 10 μm and less than 50 μm.

* * * * *